United States Patent [19]

Kertis et al.

[11] Patent Number: 4,926,383
[45] Date of Patent: May 15, 1990

[54] BICMOS WRITE-RECOVERY CIRCUIT

[75] Inventors: Robert A. Kertis; Douglas D. Smith, both of Puyallup, Wash.

[73] Assignee: National Semiconductor Corporation, Santa Clara, Calif.

[21] Appl. No.: 151,377

[22] Filed: Feb. 2, 1988

[51] Int. Cl.$^5$ .............................................. G11C 13/00
[52] U.S. Cl. ............................... 365/203; 365/189.01; 365/230.01
[58] Field of Search ............... 365/203, 207, 189, 190, 365/230, 202, 189.01, 230.01, 230.06

[56] References Cited

U.S. PATENT DOCUMENTS

| 4,078,261 | 3/1988 | Millhollan et al. | 365/189 |
| 4,685,086 | 8/1987 | Tran | 365/190 |
| 4,740,926 | 4/1988 | Takemae et al. | 365/189 |
| 4,744,059 | 5/1988 | Rufford | 365/189 |
| 4,768,168 | 8/1988 | Watanabe | 365/189 |
| 4,791,613 | 12/1988 | Hardee | 365/190 |

Primary Examiner—Terrell W. Fears
Attorney, Agent, or Firm—Lee Patch; Robert C. Colwell; Paul C. Haughey

[57] ABSTRACT

A BiCMOS write-recovery method and circuit for recovering bit lines in a digital memory system provides approximately 1 nS recovery time and allows a 256K BiCMOS SRAM to achieve 10 nS access time. All bit lines in the memory system connected to a column not being read are held at a high potential, approximately equal to the upper power supply. During a write, one bit line is pulled low and its complementary bit line is clamped with a bipolar transistor to an intermediate potential, thereby preloading the complementary bit line. Following a write, the bit line that was pulled low is pulled up with a bipolar transistor to the intermediate voltage. Simultaneously, the bit line and the complementary bit line are shunted together, then returned to the high potential. Undesired bootstrap capacitance effects in the bipolar transistors are minimized by connecting a plurality of pull-up transistors in parallel, and by feeding the clamping transistors with low impedance drivers.

12 Claims, 6 Drawing Sheets

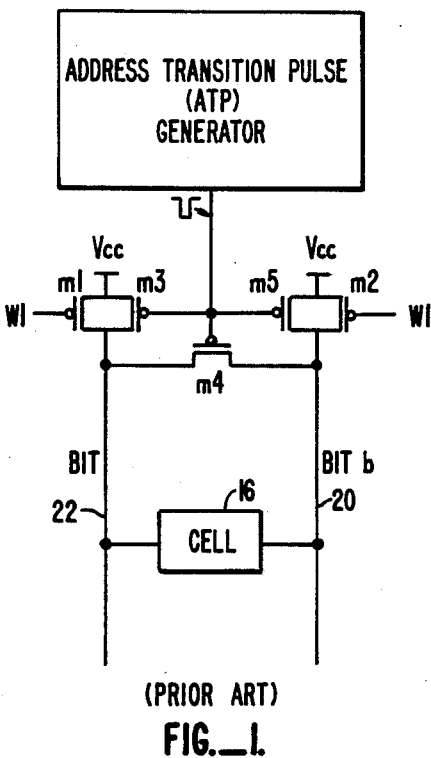
(PRIOR ART)
FIG._1.
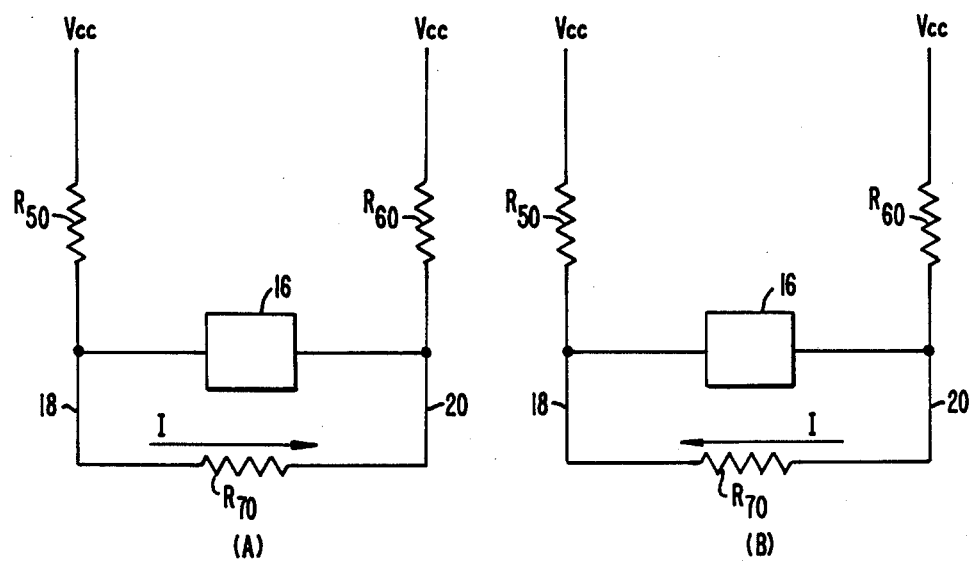
FIG._6.

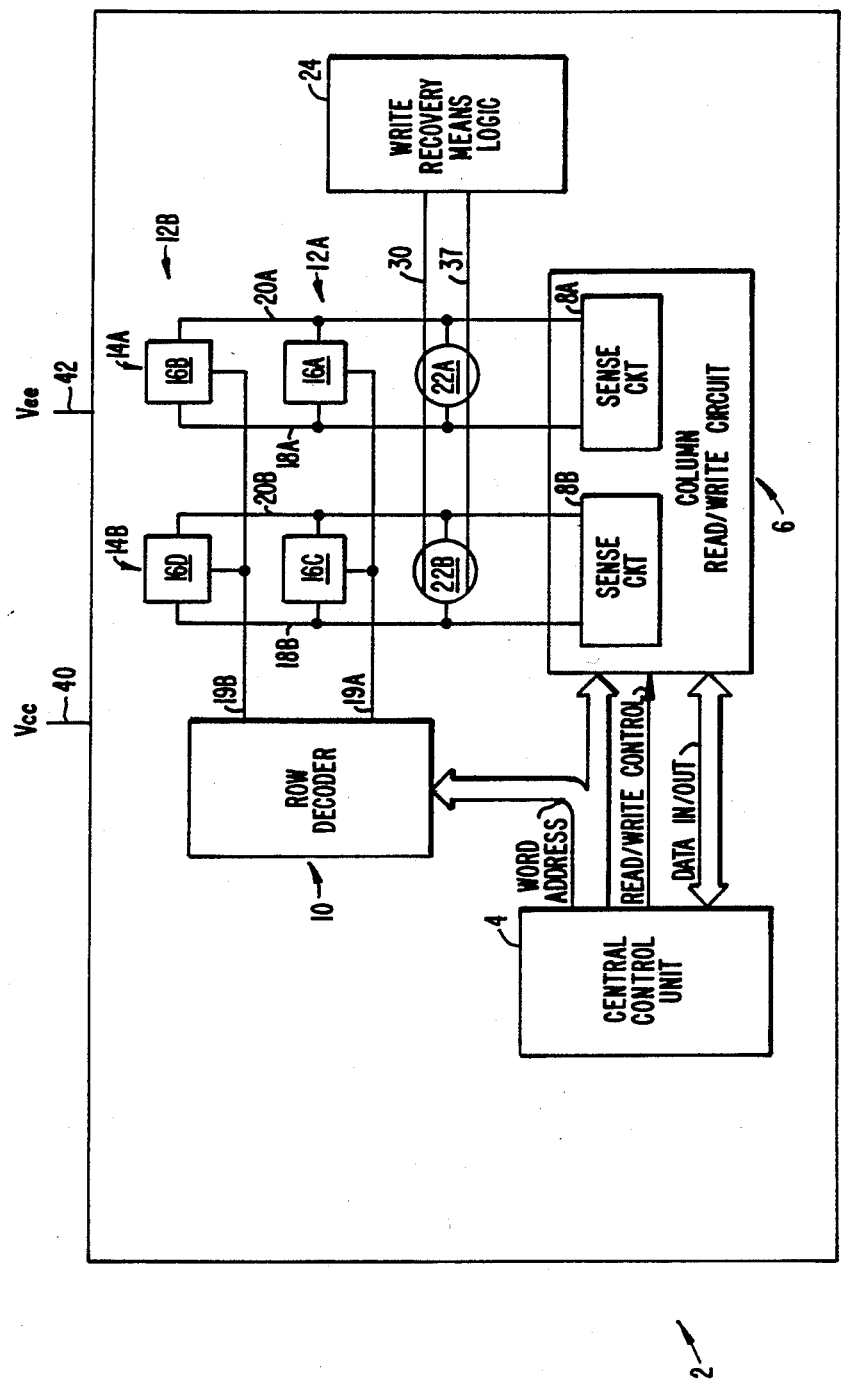
FIG.—2.

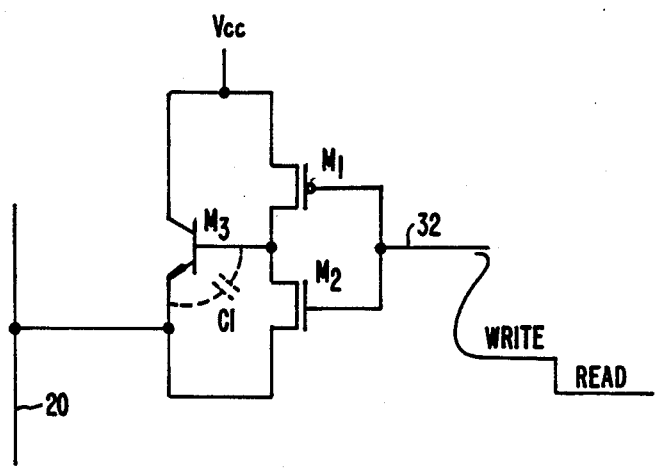
FIG._3A.
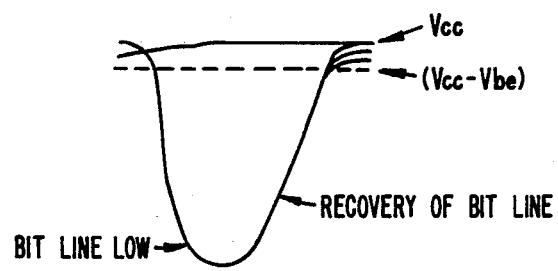
FIG._3B.

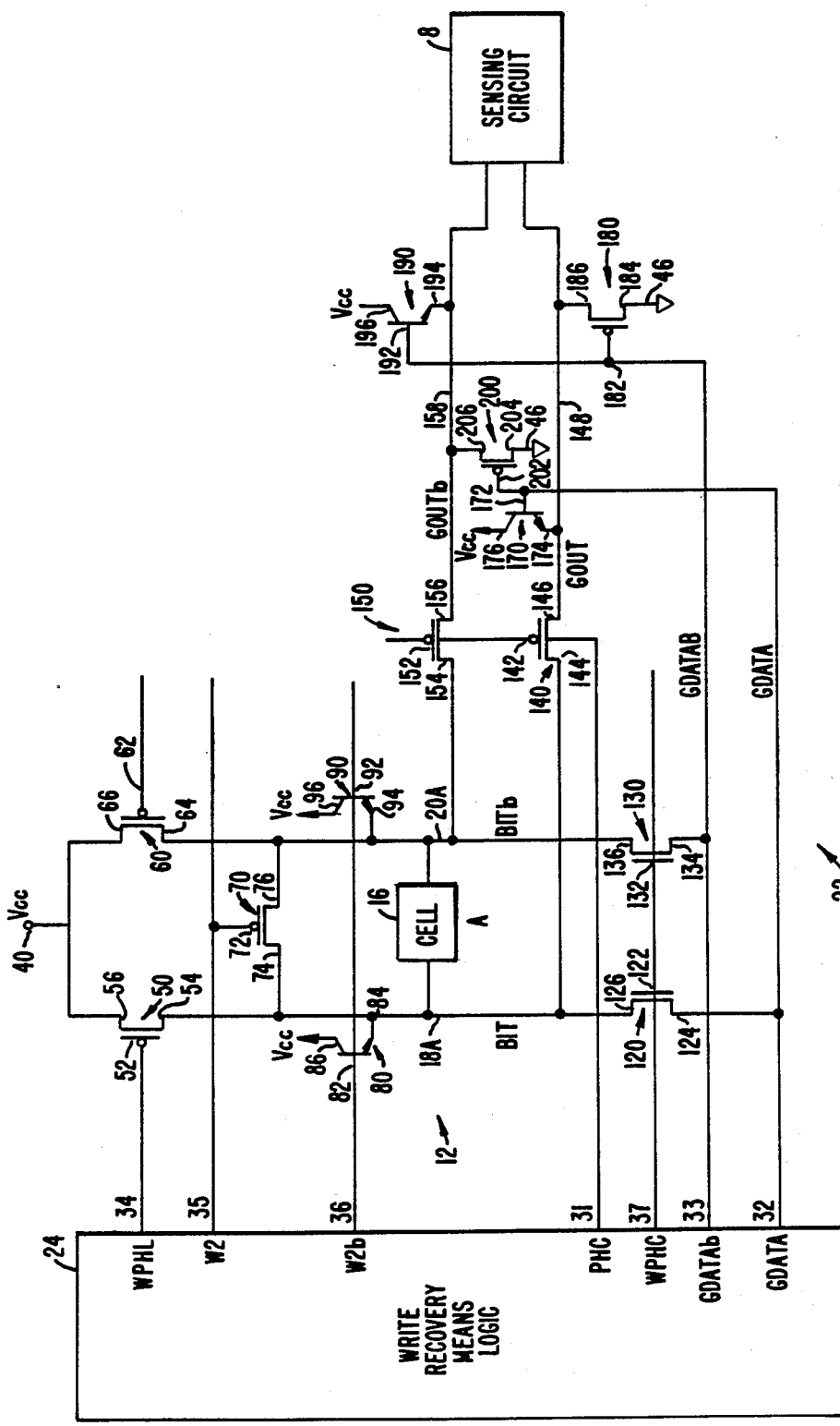
FIG._4.

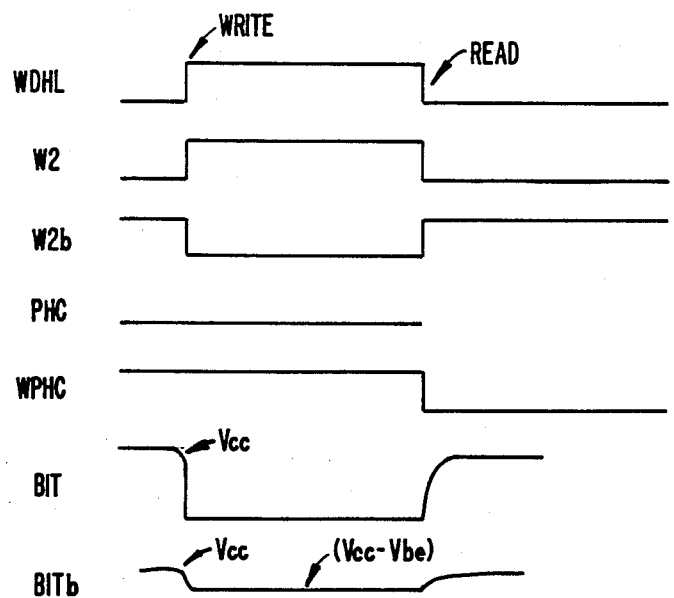
FIG._5.
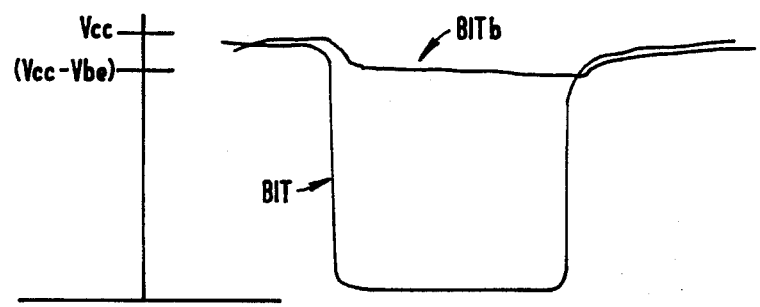
FIG._5A.

BICMOS WRITE-RECOVERY CIRCUIT

BACKGROUND OF THE INVENTION

1. Field of the Invention

This invention relates to electronic circuitry, and more particularly to memory write-recovery circuitry for static random access memories.

2. Description of the Prior Art

Digital memory circuits typically have a plurality of memory cells connected in rows and columns with bit lines and complementary bit lines connecting the cells in a column. Also on the chip are circuits for writing data to and reading data from the memory cells. In writing data a voltage transient several volts in magnitude is introduced into a bit line, while in reading data a transient of about 90 mV is sensed. Because the voltage transient of a write operation is so much larger than the transient of a read operation, in a read-follows-write sequence the write signal must be almost complete dissipated before the small differential voltage can be read. The delay waiting for the write transient to dissipate extends the access time, that is, the time to read following a write operation.

Write-recovery circuits are known which hasten removal of the transients following a write operation. A write-recovery circuit "recovers" or forces the bit lines in the column to which data last was written to be within a desired voltage differential to permit reading. During a write operation, a write recovery circuit holds all bit lines at a high potential, other than the one-bit line pulled low during the write. After the write operation, the recovery circuit pulls the low bit line up to the high potential.

A typical prior art write-recovery circuit is shown in FIG. 1. During a read operation, the circuit shown in FIG. 1 places all bit lines at the common high potential. The circuit detects when a write transition occurs, then generates an address transition pulse (ATP) which pulls the low bit line back up to the high potential. In the circuit shown in FIG. 1, transistors M1 and M2 short the bit lines to the high potential, Vcc, during a read operation. An ATP generator G1 activates transistors M3, M4 and M5 when an address transition occurs. Transistors M3 and M5 pull-up or "recover" the appropriate bit line Bit or Bitb, and at the same time transistor M4 acts as a shunt to equalize the differential voltage between Bit and Bitb. Because one of the bit lines is already at the high potential, transistor M4 causes both bit lines to be within a small voltage differential of one another, enabling a read operation to be performed.

Prior art circuits of the type shown in FIG. 1 have several disadvantages. Transistors M3 and M5 are relatively slow MOS devices resulting in relatively long recovery times. Furthermore, the width of the ATP pulse is critical: too narrow a pulse causes poor recovery and extended access time; too wide a pulse wastes time, slowing the entire memory system. In general, prior art circuits of the type shown in FIG. 1 are only capable of recovering in approximately 3 nS, and produce approximately 30 nS system access time.

SUMMARY OF THE INVENTION

The present invention provides a write-recovery circuit and method for a digital memory system. The invention has fast recovery time, thereby enabling fast system access time. In a memory system which includes the present invention, each bit line is selectively connectable to a high potential through a series connected PMOS load transistor. At the beginning of a write cycle, the PMOS load transistors are on, placing all bit lines at the high potential. During a write operation the PMOS load transistors connected to the bit line and the complementary bit line of the column to be written are turned off, enabling the selected one of the bit line or complementary bit line to be pulled low during which data is written to the cell. After data is written to the cell, the nonselected bit line is pulled down to an intermediate voltage by a bipolar clamp transistor, and a bipolar pull-up transistor pulls the selected bit line up to the intermediate voltage. As the selected line is pulled up, a shunt transistor shunts it to the nonselected line to minimize the voltage differential between the two bit lines and hasten recovery. Simultaneously, the PMOS load transistors in series with both bit lines are turned back on, returning them to the high potential. A sense amplifier circuit connected to the column being read then may be used to read the cell contents.

The use of bipolar devices to clamp bit lines contributes to the improved recovery time of the present circuit, as does "preloading" the nonselected bit line. Because bipolar devices exhibit unwanted bootstrap effects due to base-emitter junction and diffusion capacitance, the bootstrap effect in the pull-up transistors is minimized by connected the bases of the pull-up transistors in parallel and using low impedance logic drivers in the memory system read and write circuit.

The method and circuit of the present invention results in a write-recovery system that recovers bit lines approximately three times faster than known circuits. Furthermore, the present invention uses few additional components, allowing the circuit to be fabricated on the same die as the memory cells.

BRIEF DESCRIPTION OF THE DRAWINGS

FIG. 1 is a schematic of a prior art write-recovery circuit using address transition detection.

FIG. 2 is a block diagram of a generalized digital memory system including the write recovery circuit of this invention.

FIG. 3A is a schematic of a bipolar pull-up transistor and the undesired base-emitter capacitance.

FIG. 3B waveform of the circuit of in FIG. 3A.

FIG. 4 is a schematic diagram of an embodiment of the present invention.

FIG. 5A is an expanded view of part of FIG. 4.

FIGS. 6A and 6B illustrate an inverted "Pi" attenuator network.

DETAILED DESCRIPTION OF THE PREFERRED EMBODIMENTS

Figure 5:
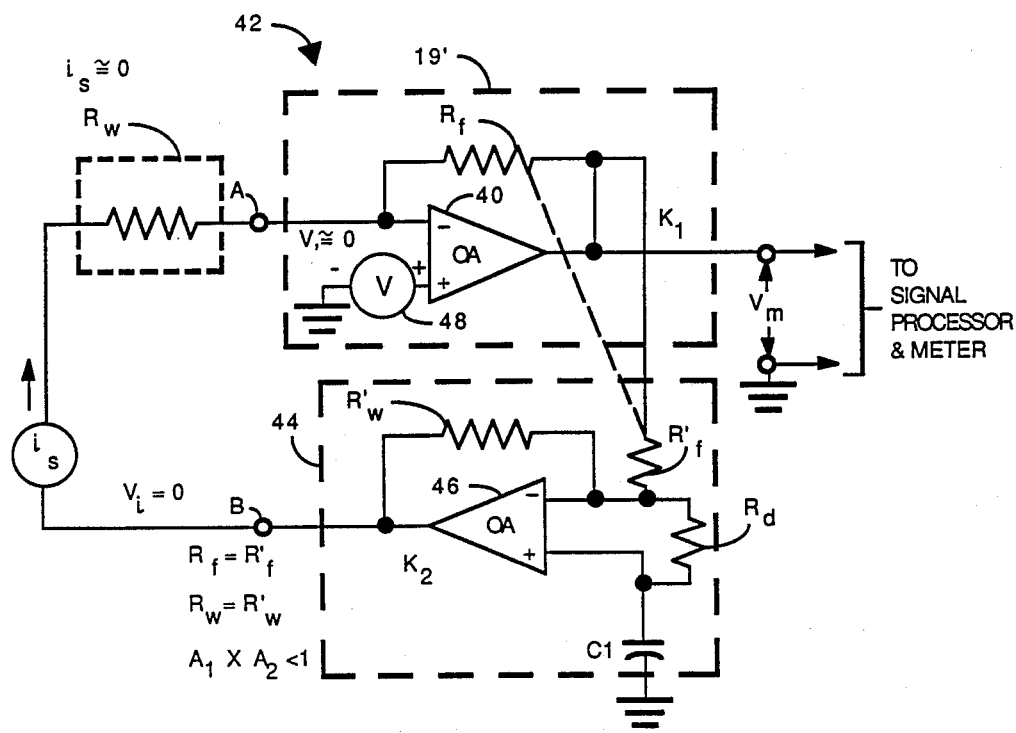
FIG. 5 is a timing diagram for the circuit of FIG. 4.

FIG. 2 is a block diagram of a portion of a digital memory system 2 that includes a central control unit 4, a column read/write circuit 6, a row decoder 10, a plurality of memory cells 16A, 16B, 16C, 16D, write recovery means 22A and 22B, row lines 19A and 19B, and bit lines 18A, 20A, 18B and 20B. Memory cells 16A, 16B, 16C, 16D are arranged in rows 12A, 12B, and columns 14A and 14B. Each of the memory cells in each column is connected between two complementary bit lines. For example, cell 16A is connected to bit lines 18A and 20A.

Column read/write circuit 6 includes sense amplifier circuits 8A and 8B connected by bit lines 18A, 20A, 18B, 20B to columns 14A and 14B. Circuit 6 receives read/write control and data input/output signals from central control unit 4. Write recovery circuits 22A and 22B receive signals from write recovery means logic 24 on seven signal lines 31-37.

Although for simplicity FIG. 2 shows memory system 2 with only two rows 12A and 12B, two columns 14A and 14B, and four cells 16A, 16B, 16C, 16D, it should be understood that most commercial memory systems would include a significantly larger number of rows, columns and cells. For example, a system could include 64 rows and 64 columns for a total of 4,096 cells. In one embodiment more than 256,000 memory cells are formed on the same die.

FIG. 4 is a more detailed schematic of part of the system shown in FIG. 2. FIG. 4 shows write recovery circuit 22 connected between bit line 18A and complementary bit line 20A. During a read operation, sense amplifier circuit 8 reads the contents of cell 16. The remaining components in circuit 22 assure that within a desired recovery time following a write, the voltage differential seen by sensing circuit 8 is within a known range. Write recovery means logic 24 provides a number of logic signals to circuit 22: PHC on line 31, Gdata on line 32, Gdatab on line 33, WPHL on line 34, W2 on line 35 and its complement W2b on line 36 and WPHC on line 37. Circuit 22 is connected to upper power supply Vcc on line 40, and to lower power supply Vee on line 46.

The PMOS load transistor 50 has its gate 52 connected to receive logic signal WPHL on line 34, its drain 54 connected in series with Bit line 18A and its source 56 connected to VCC on line 40. The other PMOS load is similarly connected in Bitb line 20A. Shunt transistor 70 has its gate 72 controlled by logic signal W2 on line 35, its source 74 connected to Bit line 18A and its drain 76 connected to Bitb line 20A.

Bipolar pull-up transistor 80 has its base 82 controlled by logic signal W2b on line 36, its emitter 84 tied to Bit line 18A, and its collector 86 tied to Vcc on line 40. The bipolar clamp transistor 170 has its base 172 connected to receive logic signal Gdata on line 32, its emitter 174 connected to receive Gout on line 148 and its collector connected to VCC on line 40. The other bipolar transistors are correspondingly connected.

In the preferred embodiment, logic signal W2b on line 36 is connected to drive 64 pairs of bipolar pull-up transistors 80 and 90 to minimize the bootstrap effect in whichever transistor 80 or 90 is on. The gate 122 of the NMOS column write transistor 120 is connected to receive logic signal WPHC on line 37, while its source 124 is connected to receive logic signal Gdata on line 32 and its drain 126 is connected to line 18A. The other NMOS column write transistor 130 is similarly connected.

The column read PMOS transistor 140 has its gate 142 connected to receive logic signal PHC on line 31, its source 144 connected to Bit line 18A and its drain 146 connected to sensing circuit 8 on line 148, denoted Gout. The other column read PMOS transistor is similarly connected.

In the preferred embodiment, sensing circuit 8 is connected to eight pairs of column read transistors 140 and 150 whose gates are driven by one of eight PHC logic signals. During a read, sensing circuit 8 is connected to whichever bit lines are in the one of eight columns whose logic signal PHC is low.

System Overview

The table below shows the sequence of operations for the overall system in which data requires line 20B to go low.

|  | Bit Line 18A | Bit Line 20A | All Other Bit Lines |
| --- | --- | --- | --- |
| Before write: | At a high potential | At a high potential | At a high potential |
| Start of write: | PMOS load transistor turned off | PMOS load transistor turned off | PMOS load transistors remain on |
| During write: | Pulled low | Pulled down from high potential to intermediate level | At high potential |
| After write: 1st step | Pulled-up to intermediate level | At intermediate level | At high potential |
| After write: 2nd step | Shunted to bit line 20A | Shunted to bit line 18A | At high potential |
| After write: 3rd step | PMOS load transistor turned on | PMOS load transistor turned on | At high potential |
| After write: 4th step | At high potential | At high potential | At high potential |

The sequence of operations is:

(1) Each bit line for columns not being written is held at approximately Vcc by means of a PMOS load transistor which is connected to Vcc;

(2) During a write, the bit line not pulled "low" is clamped to a first intermediate threshold level, equal to $(Vcc-Vbe_1)$ by a bipolar clamp transistor. As a result of the clamping action, the complementary bit line is preloaded to the first intermediate threshold voltage level;

(3) After a write, the low bit line is pulled up to a second intermediate threshold level substantially equal to the first intermediate threshold level;

(4) The bootstrap emitter-base diffusion-junction capacitance effect in each bipolar pull-up transistor is minimized by parallel-connecting the pull-up transistors in each data column block, thereby swamping out the undesired capacitance;

(5) The bootstrap emitter-base diffusion-junction capacitance effect in each bipolar clamp transistors is minimized by using a low impedance driver;

(6) After a write, the bit line that was low is shunted to its complementary bit line by a PMOS transistor; and (7) After a write, each bit line in the column just written is returned to Vcc. The PMOS load transistor connecting each bit line to the common potential, Vcc, is turned on during read, to return each bit line to the highest threshold level, approximately Vcc.

While cell 16 is being written, transistors 50, 60, 70, 80, 90 are off; otherwise they are on. Furthermore, in the 63 nonselected columns, PMOS transistors corresponding to transistors 50, 60 and 70 are on. Thus, in 63 of the columns, bit lines corresponding to Bit line 18A and Bitb line 20A are all at a highest common threshold level, approximately upper power supply Vcc.

During a write operation, a signal from write recovery logic 24 passes through NMOS column write transistors corresponding to transistors 120 or 130 and pulls low the appropriate bit line connected to the cell being written. Pulling the bit line low causes the particular cell to change states, if necessary, thus writing information to the cell. The other bit line remains high. The high bit line then is clamped to an intermediate threshold level, (Vcc-Vbe$_1$), by bipolar clamp transistor 170 or 190, where Vbe$_1$ is the base-emitter voltage drop of bipolar clamp transistor 170 or 190.

When reading information from the cell that was written, column read transistors 140 and 150 connect bit lines 18A and 20A to sensing circuit 8. At the same time, bipolar pull-up transistor 80 or 90 pulse up to the intermediate threshold level, (Vcc-Vbe$_2$), whichever bit line was low, where Vbe$_2$ is the base-emitter voltage drop of bipolar pull-up transistor 80 or 90. The complementary bit line has been preloaded and is already at the intermediate threshold level, (Vcc-Vbe$_1$). Because Vbe$_1 \approx$ Vbe$_2$, both bit lines will be at approximately the same potential, and thus "recovered." To help rapidly reduce any potential difference between the bit lines, PMOS transistor 70 shunts the bit lines together.

During a read operation, PMOS transistors 50, 60 and 70 are all on and form an inverted "Pi" attenuator network across cell 16. FIGS. 6A and 6B illustrate the inverted "Pi" network. In FIG. 6, impedances R50, R60, R70 represent the on impedance of transistors 50, 60 and 70. During a read operation, memory cell 16 causes current I to flow across shunt transistor 70. Depending upon whether cell 16 contains a "0" or a "1", the polarity of the current will be either as shown in FIG. 6A or 6B. The common mode potential across cell 16 is approximately Vcc because transistors 50 and 60 are on. The on impedance of shunt transistor 70 is approximately 1000 ohms and current I produces a differential voltage across this impedance, i.e., between bit lines 18A, 20A that is approximately ±90 mV. Sensing circuit 8 receives Bit and Bitb and reads from the differential voltage whether cell 16 contains a "0" or a "1".

As mentioned, bipolar pull-up or clamping devices shorten recovery time in a write-recovery circuit, but base-emitter capacitance in the bipolar devices can result in lengthened access times. FIGS. 3A and 3B illustrate the capacitance problem. FIG. 3A shows a simplified write-recovery system using a single bipolar pull-up transistor M3 connected to bit line 20, and driven by MOS transistors M1 and M2. Capacitor C1 represents the junction and diffusion capacitance of M3. The emitter of M3 is connected to bit line 20, and the input to drive transistors M1 and M2 is connected to line 32 when write recovery logic signals are present.

During a write operation in the circuit of FIG. 3A, the write recovery logic signal turns M2 on, which turns M3 off, effectively removing M3 from bit line 20. Any base charge present on C1 is discharged through M2. During a read, M2 is off, M1 and M3 are on, and M1 charges the base of M3 and capacitor C1. Ideally, the emitter of M3 and bit line 20 are pulled up to (Vcc-Vbe), where Vbe is the base-emitter voltage of M3. The presence of C1 bootstraps the base and thus the emitter voltage, with the result that bit line 20 may be pulled up to between Vcc and (Vcc-Vbe). When M3 is turned on, base drive from M1 charges capacitor C1. As the voltage at the base of M3 rises, the emitter voltage follows. Any extra drive charge on C1 produces extra base current, which is multiplied by beta and produces extra emitter current. The extra emitter current produces an increasing emitter voltage that can exceed the base voltage. The increased emitter voltage then feeds back through C1, increasing the base voltage. The bootstrapping can produce a base voltage higher than Vcc, and the emitter voltage can be anywhere between Vcc and (Vcc-Vbe).

FIG. 3B illustrates the M3 emitter voltage on bit line 20 as M3 attempts to recover the bit line to (Vcc-Vbe). Bit line 20 may be recovered to any voltage between Vcc and (Vcc-Vbe), depending on the base drive provided by M1 and the magnitude of C1. Placing a relatively large capacitor in shunt across the base of M3 to ground minimizes the bootstrap effect because the shunt capacitor will absorb any extra base drive. Alternatively, driving the base of M3 from a low impedance voltage source will prevent the base voltage from rising above the voltage.

As previously explained, the figures show only a few rows and columns explicitly. Because two pull-up transistors are connected to a column, for a 64-column embodiment there are 128 pull-up transistors per data block. During write-recovery, one pull-up transistor is on and the remaining 127 pull-up transistors are off. In this embodiment, the bases of all 128 bipolar pull-up transistors in a data block are connected in parallel. The effective shunt capacitance resulting from 127 transistor bases connected in parallel absorbs any extra base drive in the one bipolar pull-up transistor that is on. This technique minimizes the bootstrap effect in the bipolar pull-up transistors without using any additional components.

Timing Diagram

FIG. 5 shows the various input signals on lines 31 to 37 provided by write recovery means logic 24 to circuit 22. Prior to a write, all bit lines 18A, 20A in all columns are at the highest threshold level, approximately potential Vcc, because during the last read, all PMOS load transistors 50 and 60 were on. As determined by the write recovery means logic 24, signal W2 on line 35 goes high and its complement W2b on line 36 goes low, turning off shunt transistor 70, pull-up transistor 80, and pull-up transistor 90. Then signal WPHL on line 34 goes high, turning off load transistors 50 and 80.

Signal WPHC on line 37 then goes high to select column 14 for writing. Either column write NMOS transistor 120 or 130 turns on, depending upon which of Gdata or Gdatab is low. Assuming Gdata is low, transistor 120 turns on, pulling line 18A low. In going low, line 18A writes information into cell 16. Logic circuit 24 makes signal PHC on line 31 low whenever a read or write is made to column 14. With PHC on line 31 low, transistors 140 and 150 turn on initially, because at first both bit lines 18A and 20A are high. However, once line 18A is pulled low, transistor 140 will begin to turn off, while transistor 150 remains on.

Column read transistor 150 remains on because its gate 152 is low (PHC is low) while its source 154, connected to Bitb, is high. Therefore, Goutb on line 158 is high. Although high, Goutb is clamped to the first intermediate threshold level, (Vcc-Vbe$_1$), by transistor 190 whose emitter 194 is connected to load transistor 200. Base 192 is connected to receive Gdatab on line 33 and therefore is high. Emitter 194 is high at Vcc-Vbe$_1$, and because transistor 150 is on, line 20A is clamped at Vcc-Vbe$_1$. Load transistor 200 will try to turn on because gate 202 is low and its drain 206 is at potential Vcc-Vbe$_1$. Turning transistor 200 on, however, merely lowers the load impedance seen by transistor 190, whose emitter 194 remains at Vcc-Vbe$_1$. Therefore, during write, Goutb on line 158 will be Vcc-Vbe$_1$.

Next, transistor 140 begins to turn off because its gate 142 is connected to receive PHC on line 31, and its source 144 is connected to line 18A, also low. Drain 146 has been high, and this drain potential will drop to approximately an NMOS threshold voltage above the potential of PHC, at which point transistor 140 will turn off. During write, the potential of drain 146 will drop to approximately 1.5 volts above lower supply Vee. Clamp transistor 170 is off because Gdata on line 32 is low. Therefore, during write, Gout on line 148 will be approximately 1.5 volts above Vee.

After a write operation, circuit 24 pulls logic signal W2 on line 35 low, which turns on transistor 70, shunting line 18A to line 20A, with an impedance of about 1000 ohms. Logic signal W2b on line 36 goes high. It does not turn on transistor 90 because its emitter 94 is connected to line 20A, while Bitb is clamped to the first intermediate threshold level. W2b turns on transistor 80 because its emitter 94 is connected to line 18A which is low. As transistor 80 turns on, its emitter 84 pulls line 18A up to the second intermediate threshold level, Vcc-$Vbe_2$. Since $Vbe_1 \approx Vbe_2$, both bit lines are now at substantially the same potential.

Next, logic signal WPHL on line 34 goes low, turning on transistors 50 and 60, thereby pulling line 18A and line 20A up toward Vcc. Transistors 50 and 60, and transistor 70 are all on and together form an inverted "Pi" network across cell 16 as shown in FIG. 6. Together transistors 50, 60 and 70 raise the common mode potential across cell 16 to approximately Vcc, and minimize the voltage across cell 16 to within a desired differential of each other, approximately ±90 mV. Then, whichever of line 32 or line 33 was pulled low, is pulled high again. As Gdata on line 32 is pulled high, transistor 170 becomes active, pulling Gout on line 148 to the first threshold level.

WPHC on line 37 is then pulled low. During the write, transistor 120 was on and transistor 130 was off. When WPHC goes low, whichever of transistor 120 or 130 was on is turned off. With transistors 120 and 130 off, line 18A and line 20A are no longer affected by changes in Gdata or Gdatab. Gout on line 148 and Goutb on line 158 are both high. As transistors 50 and 60 pull lines 18A and 20A toward Vcc, clamp transistors 170 and 190 turn off because their emitters are raised to a potential higher than their bases.

The foregoing description has included many specific details for purposes of illustration. The scope of the invention is set forth in the appended claims.

We claim:

1. In a memory system which includes a memory cell (16), first and second bit lines (18A, 20A) connected to the memory cell, means (120, 130), coupled to said first and second bit lines, for writing information into the memory cell by decreasing the voltage on a selected one of the first and second bit lines, and reading means (8), coupled to said first and second bit lines, for reading information from the memory cell through the voltage differential between said bit lines, a write-recovery circuit comprising:
   first and second clamping means (170, 190), coupled to said first and second bit lines, respectively, for selectively clamping the nonselected bit line to a first intermediate voltage while the information is being written; and
   first and second pull-up means (80, 90), coupled to said first and second bit lines, respectively, for selectively coupling the selected bit line to the first intermediate voltage after the information has been written, whereby after information is written into said cell, said bit lines have a low voltage differential and can be read quickly.

2. A circuit as in claim 1 wherein each of said first and second clamping means and said first and second pull-up means comprises a separate bipolar transistor.

3. A circuit as in claim 2 wherein each clamping transistor has an input terminal, and further including means for connecting the input terminals of said first and second clamping transistors to the input terminals of a plurality of additional clamping transistors for a plurality of additional memory cells in parallel.

4. A circuit as in claim 1 further including means for interconnecting the bit lines of cells other than the cell into which information is written to a first voltage.

5. A circuit as in claim 1 further including means for shunting the first bit line to the second bit line while the information is being read.

6. A circuit as in claim 5 wherein the means for shunting comprises a transistor.

7. A circuit as in claim 1 further including third means for connecting the bit lines to a first voltage while the information is being read.

8. A circuit as in claim 7 wherein the third means for connecting comprises a transistor.

9. The circuit of claim 6 wherein said shunting transistor is an MOS transistor.

10. The circuit of claim 1 wherein said first and second clamping means are first and second bipolar transistors, and further comprising first and second MOS transistors, having gates coupled to the bases of said first and second bipolar transistors, respectively, for providing a path from said intermediate voltage and such bipolar transistor to a low voltage level.

11. The circuit of claim 1 further comprising first and second load transistors coupling said first and second bit lines, respectively, to a supply voltage, said first and second load transistors having control electrodes coupled to a first control line, said first and second pull-up means having control electrodes coupled to a second control line.

12. In a BiMOS static memory system which includes a static MOS memory cell, first and second bit lines connected to the memory cell, first and second MOS load transistors coupling said first and second bit lines to a voltage supply, writing means, coupled to said first and second bit lines, for writing information into the memory cell by decreasing the voltage on a selected one of the first and second bit lines, and reading means, coupled to said first and second bit lines, for reading information from the cell through the voltage differential between said bit lines, the write-recovery circuit comprising:
   first and second bipolar clamping transistors, each having a first electrode coupled to a supply voltage and a second electrode coupled to one of said first and second bit lines, and a base coupled to one of first and second control lines;
   first and second MOS clamping transistors, each having a first electrode coupled to one of said second and first bit lines, respectively, a second electrode coupled to a low voltage and a gate electrode coupled to said first and second control lines, respectively;
   third and fourth bipolar pull-up transistors, each having a first electrode coupled to said voltage supply, a second electrode coupled to one of said first and second bit lines, and a base electrode coupled to a third control line; and an MOS shunt transistor coupling said first and second bit lines together;

whereby, while said information is being written, a non-selected bit line is pulled up to near said supply voltage by one of said bipolar and MOS clamping transistors and, after information is written into said memory cell, the selected bit line is pulled up to near said supply voltage by one of said bipolar pull-up transistors, such that the voltage level of said first and second bit lines are substantially equal after the writing of information.

* * * * *